United States Patent [19]
Robb et al.

[11] Patent Number: 5,714,396
[45] Date of Patent: Feb. 3, 1998

[54] METHOD OF MAKING A HIGH VOLTAGE PLANAR EDGE TERMINATION STRUCTURE

[75] Inventors: Stephen Robb, Tempe; Paul Groenig, Chandler, both of Ariz.

[73] Assignee: Motorola, Inc., Schaumburg, Ill.

[21] Appl. No.: 529,384

[22] Filed: Sep. 18, 1995

Related U.S. Application Data

[62] Division of Ser. No. 270,281, Jul. 5, 1994, Pat. No. 5,486,718.

[51] Int. Cl.$^6$ ........................... H01L 21/765
[52] U.S. Cl. ........................... 437/31; 437/40; 437/61; 437/186; 437/980; 148/DIG. 45; 148/DIG. 126
[58] Field of Search ........................... 437/6, 31, 33, 437/40 DM, 41 DM, 61, 186, 980; 148/DIG. 45, DIG. 125, DIG. 126; 257/170, 173, 409, 487–494, 620

[56] References Cited

U.S. PATENT DOCUMENTS

| | | | |
|---|---|---|---|
| 4,157,563 | 6/1979 | Bosselaar | 257/489 |
| 4,947,232 | 8/1990 | Ashida et al. | 257/489 |
| 5,086,332 | 2/1992 | Nakagawa et al. | |
| 5,105,243 | 4/1992 | Nakagawa et al. | |
| 5,113,237 | 5/1992 | Stengl | |
| 5,266,831 | 11/1993 | Phipps et al. | 257/620 |
| 5,315,139 | 5/1994 | Endo | 257/489 |
| 5,382,825 | 1/1995 | Neilson | 257/489 |
| 5,382,826 | 1/1995 | Mojaradi et al. | 257/489 |
| 5,498,899 | 3/1996 | Palara | 257/488 |

FOREIGN PATENT DOCUMENTS

| | | |
|---|---|---|
| 576001 A1 | 12/1993 | European Pat. Off. . |
| 4-332173 | 11/1992 | Japan . |
| 2019894 | 9/1994 | Russian Federation . |
| 2011178 | 4/1979 | United Kingdom . |
| 94/16462 | 7/1994 | WIPO . |

OTHER PUBLICATIONS

W. Feiler et al., IEEE TRans. Electron Dev. 39(6)(1992)1514 "Multistep field plates for HV planar p–n junctions", Jun. 1992.

D. Krizaj et al., 8th Int'l Symp. on Power Semic. Dev. & ICs (SPSD '96) p. 247, "Diffused spiral junction termination structure . . . ", May 1996.

Solid State Electronics, 1972, vol. 15, pp. 653–657, "Enhancement of Breakdown Properties of Overlay Annular Diodes by Field Shaping Resistive Films", L.E. Clark et al.

IEEE Electron Device Letters, vol. El L–6, No. 9, Sep. 1985, "A Proposed Planar Junction Structure with Near–Ideal Breakdown Characteristics", S. Ahmad et al.

Proceedings of the IEEE, vol. 55, No. 8, Aug. 1967, "High–Voltage Planar P–N Junctions", Y.C. Kao et al.

Proceedings of 1990 International Symposium on Power Semiconductors Devices and ICs, Tokyo, "Novel Planar Junction Termination Technique for High Voltage Power Devices", T. Stockmeier et al., pp. 236–239.

Proceedings of 1992 International Symposium on Power Semiconductor Devices & ICs, Tokyo, "High Voltage (4KV) Emitter Short Type Diode (ESD)", Mitsuhiko Kitagawa et al., pp. 60–65.

*Primary Examiner*—Charles L. Bowers, Jr.
*Assistant Examiner*—Leon Radomsky
*Attorney, Agent, or Firm*—Kevin B. Jackson

[57] ABSTRACT

A semiconductor structure having an edge termination feature wherein a first doped region and a second doped region are selectively formed in a semiconductor layer. The second doped region is coupled with the first doped region and has an impurity concentration less than that of the first doped region. An insulating layer is disposed over the semiconductor layer and over at least a portion of the second doped region. A conductive layer, having a coil-shaped configuration, is disposed over the insulating layer and is coupled to the semiconductor layer.

12 Claims, 4 Drawing Sheets

METHOD OF MAKING A HIGH VOLTAGE PLANAR EDGE TERMINATION STRUCTURE

This is a division of application Ser. No. 08/270,281, filed Jul. 5, 1994, now U.S. Pat. No. 5,486,718.

FIELD OF THE INVENTION

This invention relates, in general, to semiconductor devices, and more particularly, to an edge termination structure and method.

BACKGROUND OF THE INVENTION

In planar junction semiconductor devices, junction curvature and device geometry curvature result in an increased electric field strength at the edge of the semiconductor device. This increased electric field causes premature device breakdown.

Several different types of edge termination structures have been employed in the past in an attempt to redistribute or reduce the electric field strength at the edge region of planar devices and increase the breakdown voltage. Edge termination structures have included guard rings and field plates, among others. However, these structures either require a large silicon area, require additional manufacturing process steps, or are unsuccessful in reaching near-ideal breakdown characteristics.

Accordingly, it is highly desirable to have an edge termination structure that is capable of increasing the breakdown voltage and eliminating the problems encountered in conventional edge termination schemes.

DETAILED DESCRIPTION OF THE DRAWINGS

Figure 1:
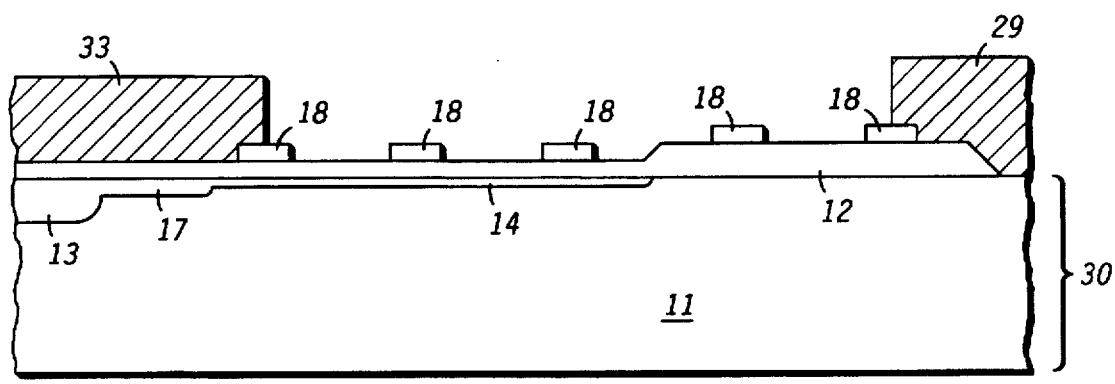
FIG. 1 is a simplified cross-sectional view of a portion of a semiconductor device having an edge termination structure in accordance with the present invention.

FIG. 1 is a simplified cross-sectional view of a portion of a semiconductor structure 10 having an edge termination feature in accordance with the present invention. Structure 10 comprises a semiconductor substrate 11 of either n-type or p-type material. Semiconductor substrate 11 may be a bulk semiconductor substrate or a semiconductor layer. As shown herein, semiconductor substrate 11 comprises silicon of an n-type material. A doped region 13 of a p-type conductivity is formed in semiconductor substrate 11 so as to form a pn junction with semiconductor substrate 11. Doped region 13 is an operational portion of a device such as a MOSFET, bipolar transistor, insulated gate bipolar transistor (IGBT) and the like. The entire device is not depicted herein, as it is not needed to adequately explain the present invention.

A doped region 14 is formed in semiconductor substrate 11 so as to form a pn junction with semiconductor substrate 11, doped region 14 being coupled to doped region 13 and laterally extended towards an edge 30 of semiconductor substrate 11. Doped region 14 is formed of the same conductivity type as doped region 13, but with an impurity concentration lower than or equal to that of the impurity concentration of doped region 13. As shown herein, doped region 14 is doped with boron at a dosage of $5 \times 10^{11}$ to $1 \times 10^{13}$ atoms/cm$^2$ and doped region 13 is doped with boron at a dosage of $5 \times 10^{14}$ to $1 \times 10^{16}$ atoms/cm$^2$. Other dopants and dosages are, of course, possible.

In a preferred embodiment, the depth of doped region 14 from the surface of semiconductor substrate 11 (approximately 1.8 to 3.7 μm) is less than the depth of doped region 13 from the same surface (approximately 4.0 to 5.5 μm). An insulating layer 12 is disposed on the surface of semiconductor substrate 11. Insulating layer 12 may be a field oxide or other insulator well-known in the art. In a preferred embodiment of the invention, insulating layer 12 varies in thickness, with the portion of greatest thickness having a thickness of approximately 1.5 to 3.5 μm and disposed near edge 30.

A conductive layer 18 is disposed on the surface of insulating layer 12 so as to extend over at least a portion of doped region 14. One end of conductive layer 18 is electrically coupled to semiconductor substrate 11 by a coupling contact 29 and the other end of conductive layer 18 is connected to a metal field plate 33. In a preferred embodiment shown in FIGS. 1 and 2, conductive layer 18 is formed in a spiral or coil configuration, the spiral or coil configuration being constructed with minimal spacing between mutually adjacent portions of the coil (for example, 2.5 to 6.5 μm) so as to obtain high resistance and gradual gradation. The configuration of conductive layer 18 and the spacing between mutually adjacent portions of conductive layer 18 provides flexibility in controlling the potential distribution.

Figure 2:
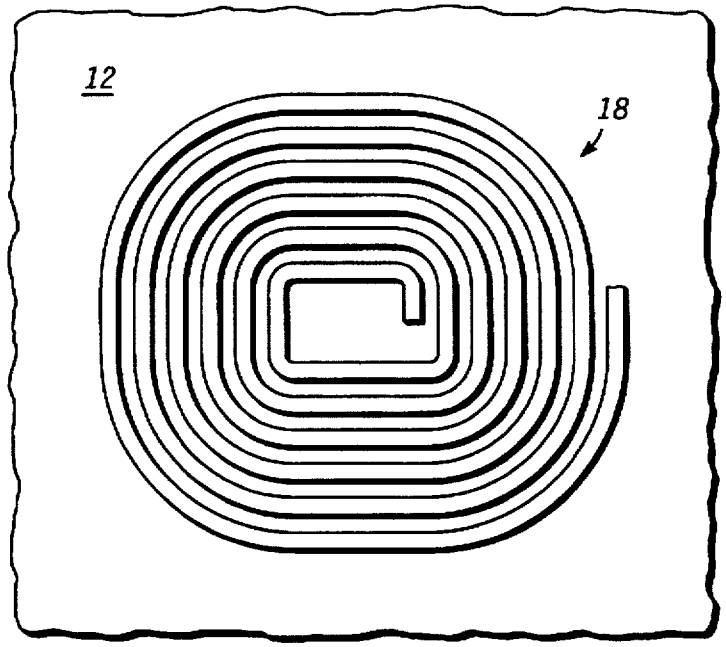
FIG. 2 is a simplified top view of an edge termination structure in accordance with an embodiment of the present invention.
Figure 3:
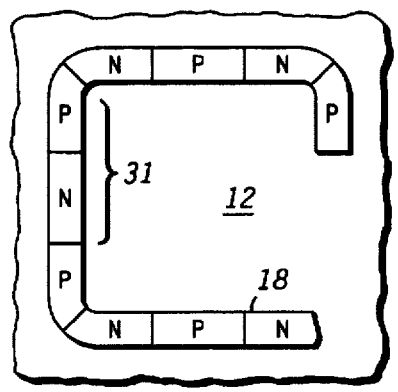
FIG. 3 is a simplified top view of an edge termination structure in accordance with an embodiment of the present invention.

Conductive layer 18 may be comprised of such material as metal or semiconductor. In a preferred embodiment, conductive layer 18 is comprised of polysilicon and is formed during the same processing steps used to form the devices in structure 10. In order to produce the necessary resistive values to reduce the electric field strength at edge 30 without having excessive leakage, for example, resistive values greater than ten megohms, conductive layer 18 may be comprised of a passive element or an active element, as shown in FIGS. 2 and 3. By varying the potential along conductive layer 18 by way of ohmic drop, as shown in FIG. 2, or in discrete fashion by way of, for example, polysilicon diodes, as shown in FIG. 3, the electric field at edge 30 is reduced and premature device breakdown prevented.

FIG. 2 is a simplified top view of conductive layer 12 comprised of a passive element in accordance with an embodiment of the present invention. In this embodiment, conductive layer 18 is formed of polysilicon. The resistivity of polysilicon is easier to control than the resistivity of amorphous silicon or semi-insulating polycrystalline silicon (SIPOS). Conductive layer 18 may then be doped with either n-type or p-type impurities. In a preferred embodiment, conductive layer 18 is doped with boron at a dosage of $5\times10^{12}$ to $1\times10^{15}$ atoms/cm$^2$.

FIG. 3 is a simplified top view of conductive layer 18 comprised of an active element in accordance with another embodiment of the present invention. In this embodiment a plurality of diodes 31 are formed in conductive layer 18. Diodes 31 achieve high resistance by means of pn junctions and do not require high resistivity material similar to the embodiment of FIG. 2. Diodes 31 as shown are of alternating conductivity type. Diodes 31 may be formed by forming conductive layer 18 of polysilicon and then selectively doping conductive layer 18 to form diodes 31. Preferably diodes 31 have a dopant concentration of approximately $1\times10^{17}$ to $1\times10^{20}$ atoms/cm$^3$ for the p regions and $1\times10^{15}$ to $2\times10^{20}$ atoms/cm$^3$ for the n regions.

FIGS. 4–9 illustrate cross-sectional views of an embodiment of the present invention during various stages of processing. The fabrication of an edge termination feature with an n-channel vertical MOSFET will be described, however, the present invention may be integrated with a p-channel MOSFET or other devices such as bipolar transistors and IGBTs. The reference numerals shown correspond to those shown in FIGS. 1–3.

Figure 4:
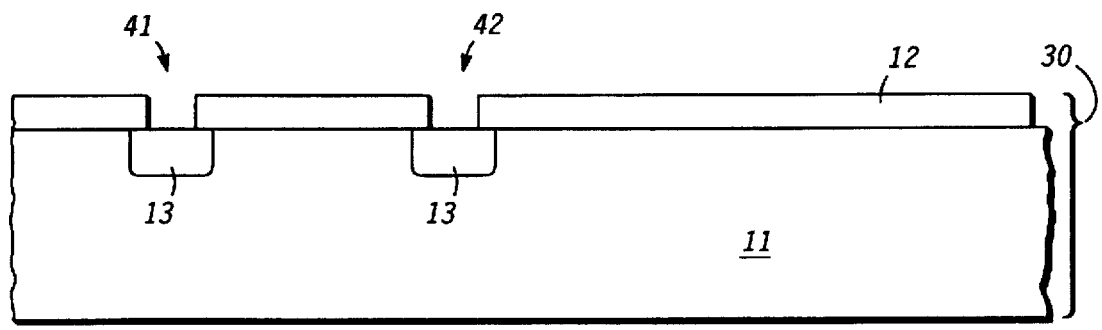
FIG. 4 illustrates a cross-sectional view of an embodiment of the present invention during a beginning stage of processing.

FIG. 4 illustrates an early stage of fabrication. First, semiconductor substrate 11 of n-type silicon is provided. Next, an insulating layer 12, such as silicon dioxide, is formed on the surface of semiconductor substrate 11 and patterned to form openings 41 and 42 using standard techniques well-known in the industry. P-type regions 13 are then formed in a portion of semiconductor substrate 11 utilizing insulating layer 12 as a mask.

Figure 5:
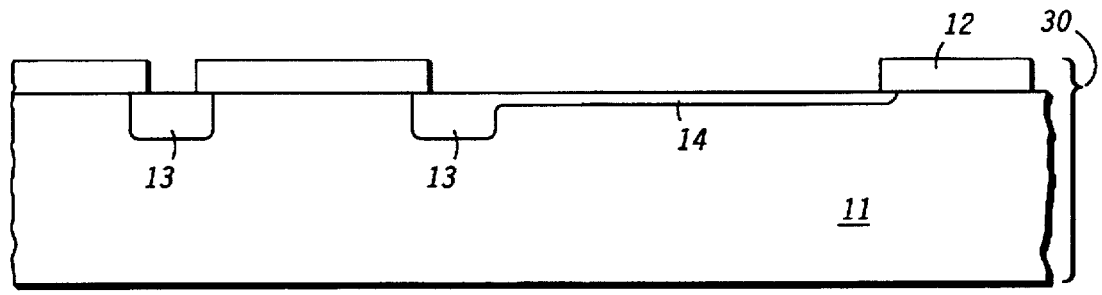
FIG. 5 illustrates a cross-sectional view of an embodiment of the present invention during an intermediate stage of processing.

FIG. 5 illustrates the structure of FIG. 4 with a portion of insulating layer 12 selectively removed to expose a portion of semiconductor substrate 11 adjacent to one p-type region 13. A doped region 14 is formed by implanting a p-type dopant into semiconductor substrate 11 by conventional techniques.

Figure 6:
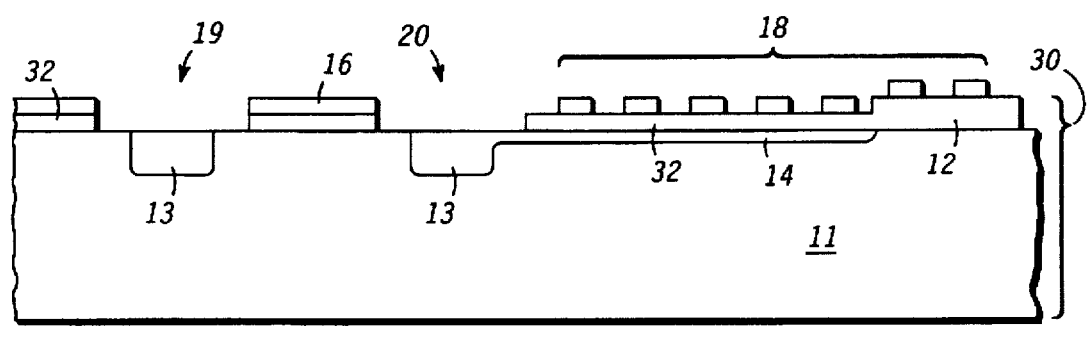
FIG. 6 illustrates a cross-sectional view of an embodiment of the present invention during an intermediate stage of processing.

Next, as shown in FIG. 6, portions of insulating layer 12 are removed which are not at edge 30. An insulating layer 32 is formed on semiconductor substrate 11 and insulating layer 12, however insulating layer 32 is not shown on insulating layer 12 for illustrative convenience. A polysilicon layer is then formed on insulating layer 32 and insulating layer 12 and the polysilicon layer is then selectively etched to provide conductive layer 18 and to provide a polysilicon layer to be used in devices in structure 10, such as, a gate electrode 16. Insulating layer 32 may also be selectively etched so as to provide openings for active areas 19 and 20 surrounding p-type regions 13. The polysilicon layer of conductive layer 18 is preferably patterned in a spiral or coil configuration.

Figure 7:
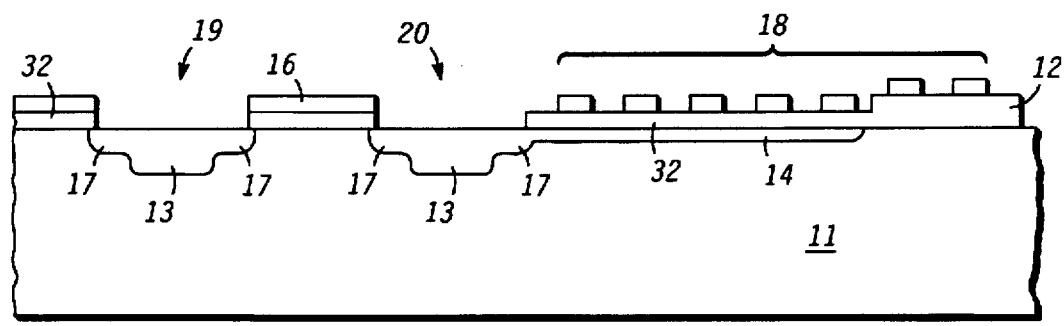
FIG. 7 illustrates a cross-sectional view of an embodiment of the present invention during an intermediate stage of processing.

In a preferred embodiment, and as shown in FIG. 7, a p-type doped region 17 is formed by ion implantation with an impurity dosage greater than that of doped region 14, but less than that of doped region 13. Conductive layer 18 and gate electrode 16 are also doped p-type, and may be doped during the formation of p-type region 17 to eliminate process steps.

Figure 8:
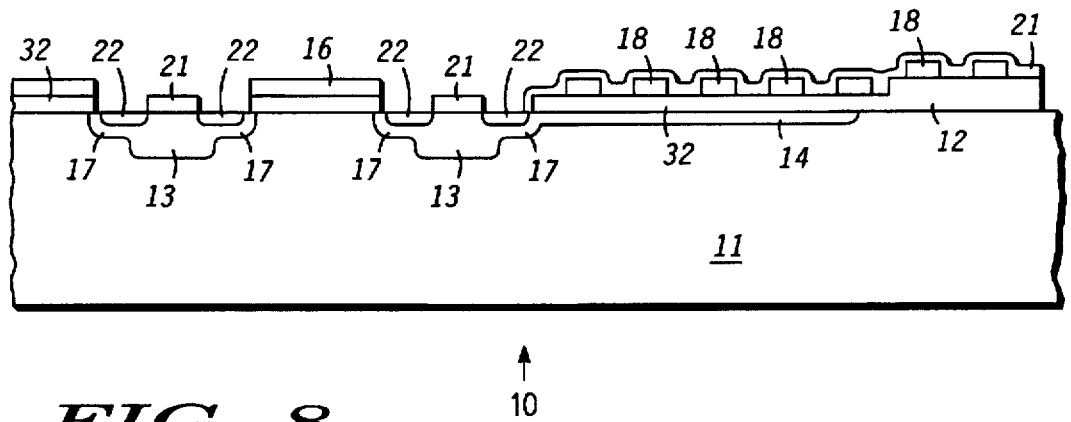
FIG. 8 illustrates a cross-sectional view of an embodiment of the present invention during an intermediate stage of processing.

In FIG. 8, n-type doped region 22 is then selectively formed using a photoresist mask 21 formed over a portion of p-type region 13. If a passive element, such as a resistor, is to be formed in conductive layer 18, then photomask 21 is also formed completely over p-type conductive layer 18 to prevent conductive layer 18 from being doped n-type during the formation of doped region 22. If a plurality of diodes are to be formed in conductive layer 18, as shown in the embodiment of FIG. 3, then photomask 21 is formed over selected portions of conductive layer 18 so as to allow n-type regions to be formed in portions of conductive layer 18 simultaneously with the forming of n-type doped region 22.

In this manner, the edge termination feature in accordance with the present invention can be fabricated during the same processes as device fabrication and without increasing the number of process steps.

Figure 9:
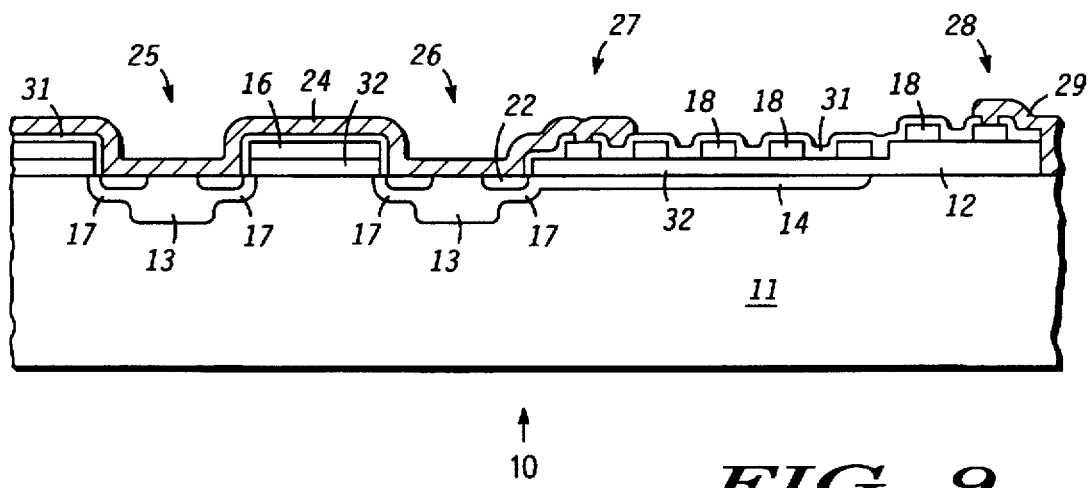
FIG. 9 illustrates a cross-sectional view of an embodiment of the present invention during a final stage of processing.

Thereafter, as shown in FIG. 9, an insulating film 31 is provided with contact holes 25, 26, 27, and 28, using photolithographic and etching techniques according to conventional methods. Finally, a metallization layer 24 is formed and patterned to provide coupling contact 29 for electrically coupling one end of conductive layer 18 to semiconductor substrate 11, which serves as the drain of the MOSFET, and to couple the other end of conductive layer 18, via metal field plate 33, to n-type regions 22 which serve as the source of the MOSFET.

Thus, in accordance with the present invention, an improved edge termination structure is provided that prevents premature device breakdown. Additionally, a large silicon area and additional manufacturing process steps are not required to implement the present invention. The combination of doped region 14 and conductive layer 18 provide an edge termination feature that both achieves high voltage and is stable in avalanche. Conductive layer 18 alone, without doped region 14, does not achieve high voltage. With doped region 14, absent conductive layer 18, the voltage collapses during avalanche. However, the combination of conductive layer 18 and doped region 14 provides a high, stable voltage that is achieved without any additional processing steps and without any requirements to control the resistivity of highly resistive films such as amorphous silicon or SIPOS.

While the invention has been described in conjunction with several specific embodiments, it is evident to those skilled in the art that many further alternatives, modifications, and variations will be apparent in light of the foregoing description. Thus, the invention described herein is intended to embrace all such alternatives, modifications, applications, and variations as may fall within the spirit and scope of the appended claims.

What is claimed is:

1. A process for forming a semiconductor device, comprising the steps of:

providing a semiconductor substrate of a first conductivity type, said semiconductor substrate having a surface and an edge;

forming a first doped region of a second conductivity type in said semiconductor substrate, said first doped region extending to a first depth from said surface;

forming a second doped region of said second conductivity type in said semiconductor substrate, said second doped region extending to a second depth from said surface which is less than said first depth, said second doped region coupled with said first doped region and having an impurity concentration less than that of said first doped region, wherein said second depth is substantially uniform;

forming an insulating layer over said semiconductor substrate and over at least a portion of said second doped region;

forming a conductive layer with a coil-shaped configuration over said insulating layer; and coupling said conductive layer with said semiconductor substrate and said first doped region.

2. The process of claim 1 wherein said step of forming said conductive layer includes forming a conductive layer comprised of polysilicon.

3. The process of claim 1 wherein said step of forming said conductive layer includes forming a conductive layer comprised of a plurality of diodes.

4. The process of claim 1 wherein said step of forming said insulating layer includes forming an insulating layer that varies in thickness, with a thickest portion disposed near said edge.

5. A method for forming a semiconductor structure having an edge termination feature comprising the steps of:

providing a semiconductor layer of a first conductivity type and having an edge;

forming a first doped region of a second conductivity type in the semiconductor layer to form a pn junction together with the semiconductor layer, wherein the first doped region has an impurity concentration higher than that of the semiconductor layer;

forming a second doped region of the second conductivity type in the semiconductor layer, wherein the second doped region is coupled with the first doped region, and wherein the second doped region has an impurity concentration lower than that of the first doped region, and wherein the second doped region has a substantially uniform depth;

forming an electrically insulating layer disposed on the semiconductor layer so as to extend over the second doped region, and wherein the electrically insulating layer varies in thickness such that the electrically insulating layer is thicker towards the edge of semiconductor layer; and forming a polysilicon layer disposed over the electrically insulating layer and over at least a portion of the second doped region, wherein the polysilicon layer has a coil-shaped configuration that extends over the varied thickness of the electrically insulating layer and is electrically coupled at an inner portion to the first doped region and electrically coupled at an outer portion to the semiconductor layer, and wherein the polysilicon layer does not make direct contact to the second doped region.

6. The method of claim 5 wherein the step of forming the polysilicon layer includes forming a polysilicon layer comprised of a plurality of diodes.

7. The method of claim 5 wherein the step of forming the polysilicon layer includes forming a polysilicon layer having adjacent portions spaced from each other in a manner so as to obtain a resistance of greater than ten megohms.

8. The method of claim 5 further comprising the step of forming a second electrically insulating film over at least a portion of the polysilicon layer.

9. A method for forming a semiconductor device comprising the steps of:

providing a semiconductor substrate having a first conductivity type and an edge;

forming a first electrically insulating layer over the semiconductor substrate;

selectively patterning the first electrically insulating layer to expose a first portion of the semiconductor substrate;

forming a first doped region of a second conductivity type in the first portion of the semiconductor substrate and extending to a first depth;

selectively patterning the first electrically insulating layer to expose a second portion of the semiconductor substrate while leaving a portion of the first electrically insulating layer near the edge;

forming a second doped region of the second conductivity type in the second portion of the semiconductor substrate, wherein the second doped region is coupled to the first doped region, and wherein the second doped region has a second depth less than the first depth;

forming a second electrically insulating layer over the second doped region, wherein the second insulating layer is thinner than the first electrically insulating layer; and forming a conductive layer with a coil-shaped configuration over the first and second electrically insulating layers, wherein the conductive layer is coupled to the first doped region and the semiconductor substrate.

10. The method of claim 9 wherein the step of forming the conductive layer comprises forming a polysilicon layer.

11. The method of claim 9 wherein the step of forming the conductive layer includes forming a conductive layer comprised of a plurality of diodes.

12. The method of claim 9 further comprising the step of forming a third doped region of the second conductivity type coupled to the first doped region and the second doped region, wherein the third doped region has a third depth less than the first depth and greater than the second depth.

* * * * *